(12) United States Patent
Fiolka et al.

(10) Patent No.: US 7,593,095 B2
(45) Date of Patent: Sep. 22, 2009

(54) SYSTEM FOR REDUCING THE COHERENCE OF LASER RADIATION

(75) Inventors: Damian Fiolka, Oberkochen (DE); Manfred Maul, Aalen (DE); Nils Dieckmann, Huettlingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 311 days.

(21) Appl. No.: 10/590,537

(22) PCT Filed: Feb. 22, 2005

(86) PCT No.: PCT/EP2005/001797

§ 371 (c)(1), (2), (4) Date: Aug. 25, 2006

(87) PCT Pub. No.: WO2005/083511

PCT Pub. Date: Sep. 9, 2005

(65) Prior Publication Data

US 2007/0206381 A1   Sep. 6, 2007

(30) Foreign Application Priority Data

Feb. 26, 2004 (DE) .................. 10 2004 009 239

(51) Int. Cl.
G03B 27/72 (2006.01)
G03B 27/42 (2006.01)
(52) U.S. Cl. .................. 355/71; 355/53; 359/638
(58) Field of Classification Search .................. 355/53, 355/67, 71; 372/9; 359/638
See application file for complete search history.

(56) References Cited

U.S. PATENT DOCUMENTS 5,463,497 A   10/1995   Muraki et al. ............... 359/618
6,238,063 B1   5/2001   Tanitsu et al. ............... 362/268

(Continued)

FOREIGN PATENT DOCUMENTS

DE   19508754   9/1996

(Continued)

OTHER PUBLICATIONS

English Translation of DE 195 08 754 A1 (dated Sep. 12, 1996).*

(Continued)

*Primary Examiner*—Alan A Mathews
(74) *Attorney, Agent, or Firm*—Wells St. John P.S.

(57) ABSTRACT

The invention relates to a system for reducing the coherence of a wave front-emitting laser radiation, especially for a projection lens for use in semiconductor lithography, wherein a first partial beam of a laser beam incident on a surface of a resonator body is partially reflected. A second partial beam penetrates the resonator body and emerges from the resonator body at least approximately in the area of entry after a plurality of total internal reflections. The two partial beams are then Passed on jointly to an illumination plane. The resonator body is adapted, in addition to splitting the laser beam into partial beams, to modulate the wave fronts of at least one partial beam during a laser pulse. The partial beams reflected on the resonator body and penetrating the resonator body are superimposed downstream of the resonator body. The resonator body is provided with a phase plate having different local phase distribution.

49 Claims, 3 Drawing Sheets

U.S. PATENT DOCUMENTS 6,512,780 B1 * 1/2003 Dieckmann .................. 372/9

FOREIGN PATENT DOCUMENTS

EP          1 101 039 A2 * 11/2000

JP          1-198759      10/1989

OTHER PUBLICATIONS

K. Harding, "Speckle Reduction Methods for Laser Line Gages", SPIE vol. 3204, p. 137-144, (dated 1998).

L. Wang, "Speckle Reduction in Laser Projection Systems by Diffractive Optical Elements", Applied Optics, vol. 37, No. 10 (1998), p. 1770-1775.

* cited by examiner

SYSTEM FOR REDUCING THE COHERENCE OF LASER RADIATION

CROSS REFERENCE TO RELATED APPLICATION

This is a 35 U.S.C. §371 application of and claims priority to PCT International Application Number PCT/EP2005/001797, which was filed Feb. 22, 2005, and was published in German, and which was based on German Patent Application No. 10 2004 009 239.7, filed Feb. 26, 2004, and the teachings of all the applications are incorporated herein by reference.

BACKGROUND OF THE INVENTION

1. Field of the Invention

The invention relates to a system for reducing the coherence of a wavefront-emitting laser radiation, in particular for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane. The invention also relates to a projection exposure apparatus with a laser as a light source, an illumination system and a projection objective.

2. Description of the Related Art

In the case of projection objectives in semiconductor lithography, it is necessary to illuminate the mask, also called reticle, as homogeneously as possible by means of an illumination system. In this case, however, there is a problem when using pulsed laser light in terms of high temporal coherence of the laser radiation, as a result of which the homogeneity is disrupted by speckle, that is to say differences in bright/dark. It has already been proposed, therefore, to use the arrangement of a resonator body in the form of a prism having three corners to split the laser beam when it impinges on the resonator body, to be precise into a partially reflected partial beam and a second partial beam, which enters the resonator body, emerges from the resonator body again after corresponding total reflections in the region of the entrance location and is subsequently recombined with the reflected partial beam. In this way, the laser pulses are practically "chopped" into a plurality of partial beams which arrive temporally successively at the illumination plane, e.g. the reticle plane in the case of use in semiconductor lithography. The purpose in this case is to make the time interval between two pulses so long that it is longer than the so-called temporal coherence of the laser radiation. This means that the beam bundles are no longer capable of interference, that is to say that they can no longer form any interference. This measure is intended to result in an improvement in the illumination homogeneity.

With regard to the prior art, reference is made to EP 1 107 039 A2, U.S. Pat. No. 6,238,063 B1 and the Patent Abstract of Japan 01198759A.

SUMMARY OF THE INVENTION

The present invention is based on the object of providing a system with which the illumination homogeneity can be improved even further.

According to the invention, this object is achieved by virtue of the fact that the resonator body is formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution.

In addition to the known splitting of the laser beam into partial beams which are no longer temporally coherent with respect to one another, a modulation of the wavefronts of the laser radiation is also performed according to the invention. This gives rise to different wavefronts (local phase distributions) during a single laser pulse. To put it another way: as a result of superimposing different speckle patterns during a pulse, it is possible in this way to achieve a significant increase in the illumination homogeneity through averaging over a plurality of speckle distributions.

By means of the combination according to the invention of temporally offset wavefronts which are additionally modulated as well and thus acquire different phase distributions, it is possible to achieve a very high homogeneity by means of averaged speckle patterns. A phase plate which is fitted in the resonator body is suitable for this purpose.

In one advantageous configuration of the invention, it may be provided that the resonator body is formed as a prism having at least five corners. This is because it has been established that in comparison with a resonator body having three corners, at the generally used wavelengths of the laser beams, in particular in the VUV range (vacuum ultraviolet spectral range) or shorter, excessively steep deflection angles arise in the prism, with the result that total reflections do not occur in each case, but rather partial emergences with corresponding light losses. When using a prism having at least five corners, at least four reflections are generated, and generally minimum angles of 37 degrees can be complied with, so that total reflections always occur. In this case, calcium fluoride, in particular, has been found as a material for the resonator body according to the invention. It goes without saying, however, that other materials such as e.g. magnesium fluoride and quartz are also possible for this purpose.

Further various measures are conceivable for the modulation of a wavefront.

If the phase plate has a varying thickness, in accordance with one development of the invention, then correspondingly spatially offset wavefronts arise. In this case, varying thickness changes—relative to a direction transversely with respect to the beam direction—should occur at a distance corresponding to the order of magnitude of the spatial coherence length of the laser radiation, which should be fully modulated.

In one advantageous configuration of the invention, it may be provided that the phase plate is formed as a diffractive optical element (DOE) which is operated at the zeroth order of diffraction. A diffractive optical element is normally used at the first or else a higher order of diffraction. In order to achieve the wavefront modulation, however, the diffractive optical element (DOE) will be used at the zeroth order of diffraction, where the laser light passes through without any refraction.

A further possibility consists in the use of a diffusing screen as a phase plate.

The wavefront modulation according to the invention can also be achieved by forming the resonator body, e.g. the prism having the at least five corners in asymmetrical fashion. This may be effected e.g. by means of an asymmetrical, i.e. non-mirror-symmetrical, embodiment of at least one side of the prism.

A further solution or else a combination with an asymmetrical resonator body consists in choosing the beam guiding of the laser beam such that the centroid beam impinges eccentrically on the resonator body. In this case, modulations of the wavefront are likewise created as the partial beam circulates in the resonator body.

If the surface on which the laser beam impinges is provided with a splitter layer configured in such a way that the entrance angle can thereby be altered, the application possibilities can also be enhanced since the angle dependence can be at least partially reduced. By means of the splitter layer, it is thus possible to vary the entrance angle and thus also the ratio of the reflected partial beam and the partial beam entering the resonator body.

In order, moreover, additionally to achieve wavefront modulations, the splitter layer may e.g. be formed with a varying thickness and/or non-homogeneously. A dielectric layer with a splitting ratio of 33:67 or 1/3:2/3 can advantageously be used as the splitter layer.

Exemplary embodiments of the invention are illustrated in principle below with reference to the drawings.

DETAILED DESCRIPTION

Figure 1:
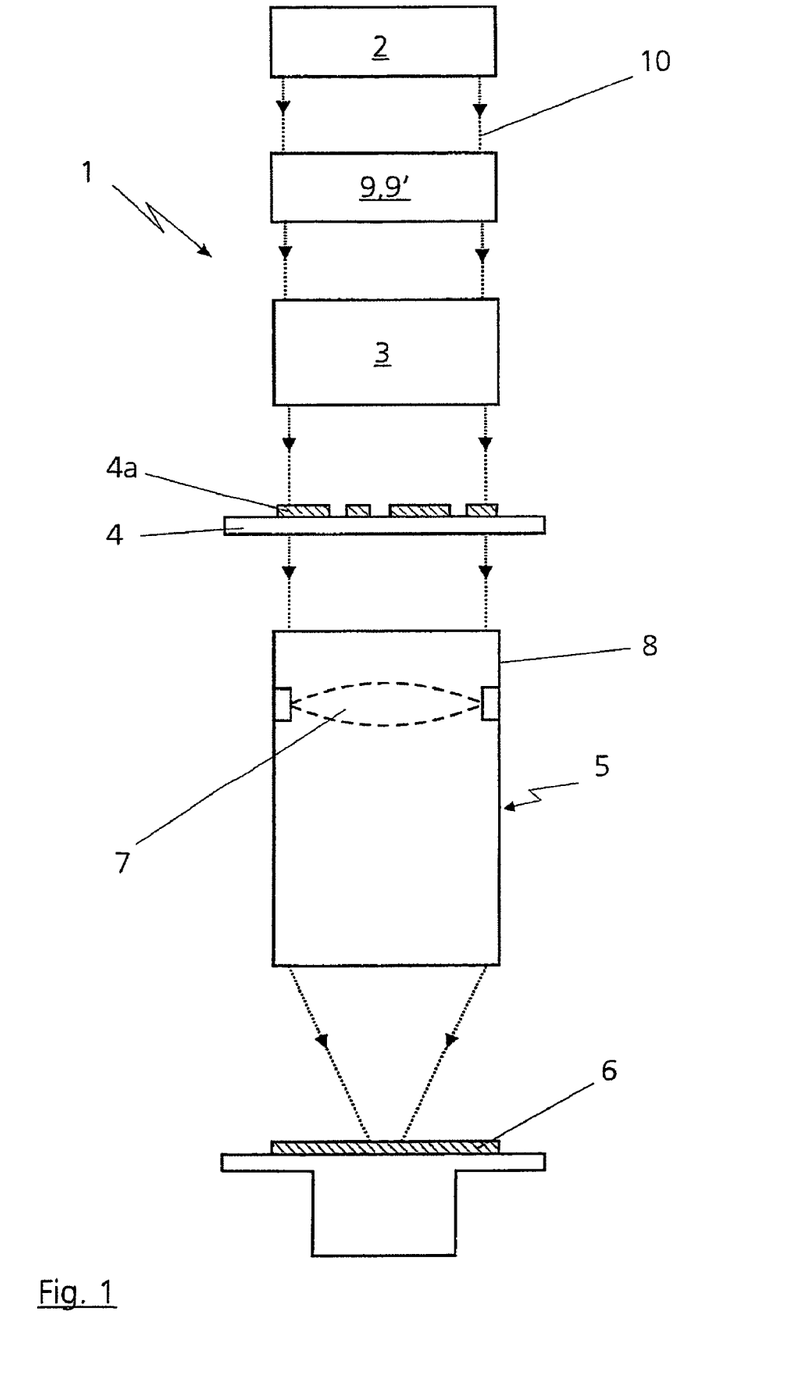
FIG. 1 shows a schematic construction of a projection exposure apparatus with a light source, an illumination system and a projection objective.

As can be seen from FIG. 1, a projection exposure apparatus 1 has a light source 2 formed as a laser, an illumination system 3 for illuminating a field in a plane 4 in which a structure-bearing mask 4a is arranged, and also a projection objective 5 for imaging the structure-bearing mask 4a in the plane 4 onto a light-sensitive substrate 6. The projection objective 5 has a plurality of optical elements 7 in its housing 8. The projection exposure apparatus 1 serves for producing semiconductor components, such as e.g. computer chips.

In the present exemplary embodiment, a resonator body 9, 9' is arranged between the laser 2 and the illumination system 3 for the purpose of reducing the, in particular, temporal coherence of a laser radiation 10 of the laser 2.

Figure 2:
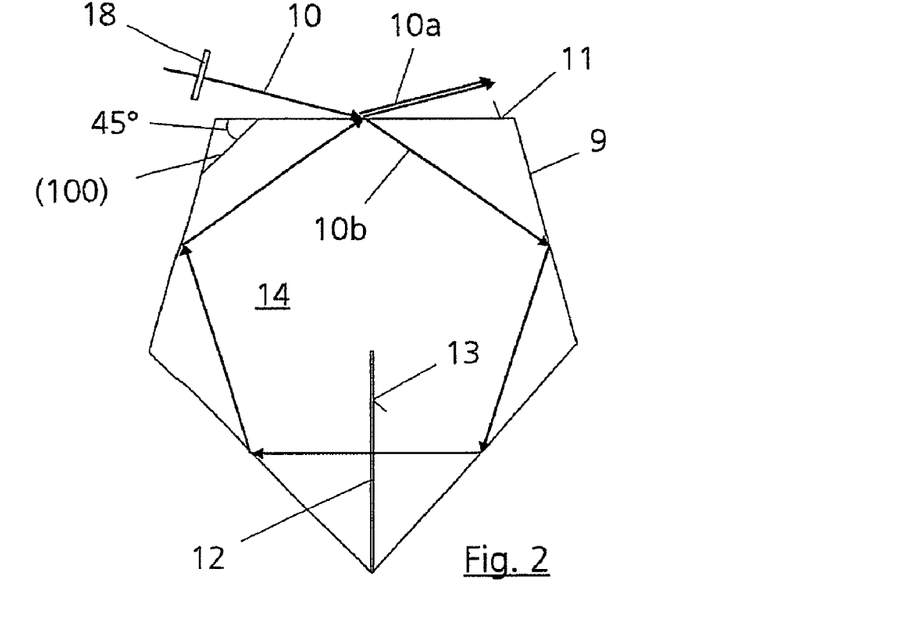
FIG. 2 shows a pentaprism as a resonator body with a phase plate.

FIG. 2 shows a pentaprism as resonator body 9.

For simplification, only the centroid beam of the incident laser beam bundle 10 is illustrated and, moreover, just the laser beam 10 is referred to below. It goes without saying that a beam bundle is present in practice. A lambda/2 plate 18 is used for setting the degree of polarization (between unpolarized and linearly polarized) of the laser beam 10. The laser beam 10 impinging on a surface 11 of the prism 9 is split into a first partial beam 10a, which is reflected at the surface 11, and a partial beam 10b, which enters the resonator body 9 and emerges there from the resonator body 9 again after a plurality of total reflections at the entrance location and is combined there with the first partial beam 10a. The two partial beams are subsequently passed to an illumination plane, in this case the plane 4 with the structure-bearing mask. Four total reflections occur in the pentagonal prism illustrated. In the case of a prism having more corners, correspondingly more total reflections are present.

In accordance with FIG. 2, a phase plate 12 projects into the prism 9, said phase plate being introduced into the prism 9 in such a way that the circulating partial beam 10b, which impinges approximately perpendicularly on a front surface 13 of the phase plate 12, has to penetrate through the latter. The phase plate 12 causes a varying local phase distribution. For this purpose, the phase plate 12 has a varying thickness, as can be seen from the enlarged cross-sectional illustrations in accordance with FIGS. 3a and 3b. As can be seen, the different thicknesses of the phase plate 12 vary in the transverse direction with respect to the beam direction in their width s. In this case—depending on the laser used and the wavelength thereof—the largest width s is intended to be of the order of magnitude of the spatial coherence length of the laser radiation used. In the case of excimer lasers, the value for s lies between 0.05 and 1 mm, a possible beam expansion correspondingly increasing the value.

Figure 3A:
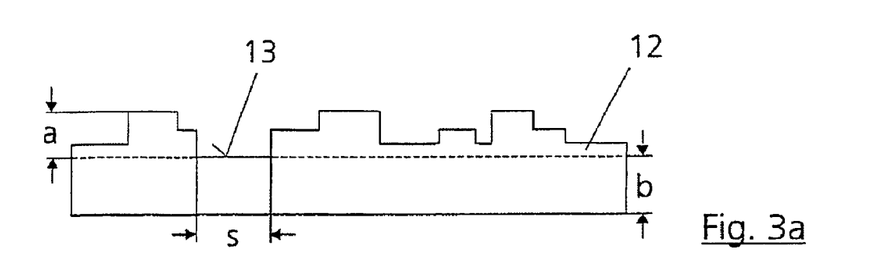
FIG. 3a shows a cross section through a phase plate according to FIG. 2.
Figure 3B:
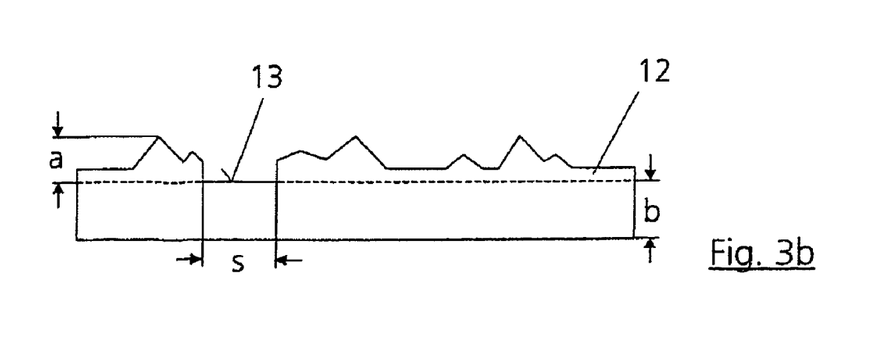
FIG. 3b shows a cross section through a further embodiment of a phase plate.

The thickness difference between the maximum and minimum thicknesses of the plate should be of the order of magnitude of a few wavelengths of the light used. At the wavelengths mentioned above, this should be between a=200 to 500 nm.

The base thickness of the phase plate b may be in the region of 500 μm.

The distribution of the width differences s and the thickness differences a should be as random as possible in order also to obtain a relatively random phase distribution on the wavefront. In this way, the optical path lengths are locally different and, in the case of the reunited partial beams 10a and 10b downstream of the resonator body 9, correspondingly temporally different partial beams are obtained which, moreover, are additionally modulated with respect to the wavefront. In this way, the individual pulses can be so short in terms of their duration and in terms of phase distribution that an interference capability is no longer provided.

In the embodiment in accordance with FIG. 3b, the structure of the phase plate 12 is embodied in tapering or prismatic fashion, thereby achieving improved beam expansion.

With the use of a pentagonal prism, angles of reflection which are greater than 37 degrees result, whereby total reflections occur in the interior, The exemplary embodiment illustrated was designed such that all the angles of total reflection are identical and are approximately 55 degrees.

Calcium fluoride can be used as material for the prism. The crystal orientation of the $CaF_2$ prism 9 is chosen such that the first (100) crystal plane forms an angle of 45° with light entrance plane, entrance face or surface 11 and is perpendicular to the side face 14. The second (100) crystal plane lies parallel to the side face 14 of the prism 9.

In this way, the intrinsic birefringence, which is significant at the wavelength of 157 nm and 193 nm, does not affect the polarization of the circulating beam if the light at the entrance surface 11 is linearly polarized and the oscillation direction of the electric field strength vector is parallel (p-polarized) or perpendicular (s-polarized) with respect to the plane of incidence. The light emerges from the prism 9 again in s- or p-polarized fashion.

If the incident beam 10 comprises unpolarized light, then the crystal orientation is not of importance and the prism 9 made of $CaF_2$ can be oriented arbitrarily.

A corresponding possibility consists in producing the block from $MgF_2$ (transparent at 157 nm and 193 nm, highly birefringent). If there is unpolarized light at the entrance, then the crystal orientation with respect to the prism faces can likewise be chosen arbitrarily.

If the light at the entrance plane or entrance surface 11 is linearly polarized (s- or p-polarized) and if the light is intended to emerge again in linearly polarized fashion, then the crystal orientation must be chosen such that the oscillation direction of the incident electric field strength vector is parallel to the fast (direction with extraordinary refractive index) or slow (direction with ordinary refractive index) crystal axis.

In this case, birefringence does not take place and the polarization state is maintained.

The phase plate 12 used may be a diffractive optical element which is optimized to the zeroth order of diffraction, at which impinging light passes through without any diffraction.

The phase plate 12 used may also be a diffusing screen.

Figure 4:
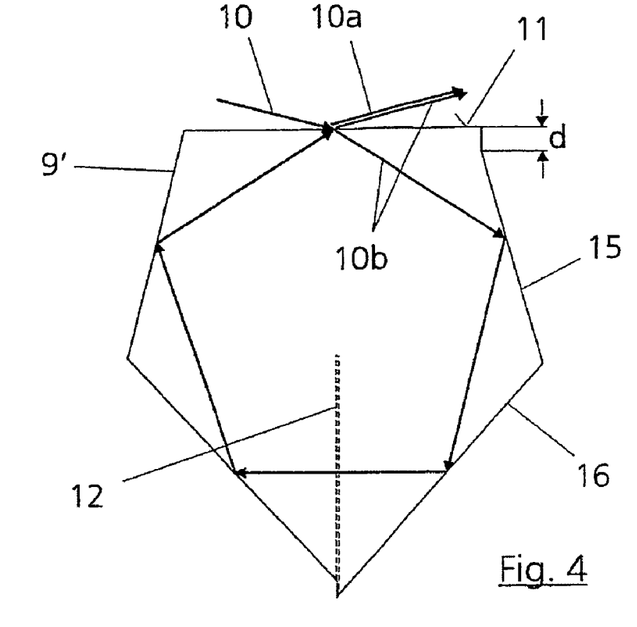
FIG. 4 shows a pentaprism with two asymmetrical sides.

FIG. 4 shows a prism in pentagonal form, an offset being present or the prism body being formed in asymmetrical fashion. As can be seen, one side, namely the first side 15, on which the partial beams 10b impinge is shifted downward by the distance d. The mirror symmetry is thus disrupted, which also applies to the subsequent side 16. What is likewise achieved in this way is that the reflected partial beam 10a and the partial beam 10b circulating in the prism 9' and thus ultimately all the partial beams run in a manner temporally and spatially offset with respect to one another. The distance d may be of the order of magnitude of 0.1 mm.

If necessary, it is additionally possible to introduce a phase plate 12 (illustrated by broken lines in FIG. 4) corresponding to the configuration according to FIG. 2, whereby the modulation of wavefronts is even more variable.

Figure 5:
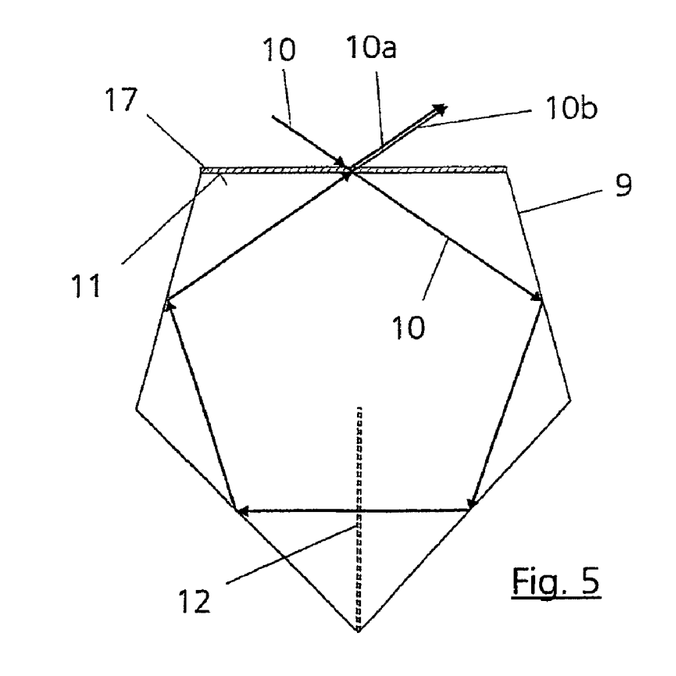
FIG. 5 shows a pentaprism with a splitter layer on a surface.

FIG. 5 shows a configuration of a prism 9, likewise in pentagonal form, a splitter layer 17 additionally being applied on the entrance surface 11.

The splitter layer may be e.g. a dielectric layer having a splitting ratio of 1/3:2/3. The splitter layer firstly has the task of influencing the entrance angle of the partial beam 10b into the prism 9. This can be chosen as desired according to the configuration and material of the splitter layer.

If the splitter layer furthermore additionally has a varying thickness, then a modulation of the wavefront is additionally achieved as well in a similar manner to that in the case of the phase plate (illustrated by broken lines in FIG. 5). The same is possible by means of an inhomogeneous or non-homogeneous embodiment of the splitter layer.

The exemplary embodiments for generating different wavefronts as illustrated in FIGS. 2, 4 and 5 can be used both separately and in arbitrary combinations with one another. By way of example, it is also possible to combine all three measures with one another, that is to say to arrange a phase plate 12 in an asymmetrical prism 9' in accordance with FIG. 4 and additionally also to provide the entrance surface 11 with a splitter layer 17 which, moreover, has a varying thickness and/or else is formed in non-homogeneous fashion.

The invention claimed is:

1. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s; and wherein the variations in the width s are of the order of magnitude of the spatial coherence length of the laser radiation at the entrance plane.

2. The system as claimed in claim 1, wherein the differences in thickness are between 200 and 500 nm.

3. The system as claimed in claim 1, wherein the value of width s lies between 0.05 mm and 1 mm.

4. The system as claimed in claim 1, wherein the phase plate is formed as a diffractive optical element (DOE) which is optimized to the zeroth order of diffraction.

5. The system as claimed in claim 1, wherein a diffusing screen is provided as the phase plate.

6. The system as claimed in claim 1, wherein the resonator body is formed as a prism having at least five corners.

7. The system as claimed in claim 1, wherein the angles of reflection in the resonator body are at least 37 degrees.

8. The system as claimed in claim 1, wherein the optical path length of the second partial beam in the resonator body is a multiple of the coherence length.

9. The system as claimed in claim 1, wherein the light impinging on the resonator body is split in a range of ratios from about 1:3 to about 2:3 with respect to the first reflected partial beam and the second partial beam circulating in the resonator body.

10. The system as claimed in claim 1, wherein at wavelengths of the laser beam of 157 nm or less, calcium fluoride is used as the resonator body.

11. The system as claimed in claim 10, wherein calcium fluoride is chosen in a crystal orientation such that the first (100) crystal plane forms an angle of 45 degrees with the plane of the surface on which the laser beam impinges, and is perpendicular to a side face, the second (100) crystal plane being parallel to said side face.

12. The system as claimed in claim 1, wherein the polarization direction of the laser beam impinging on the resonator body can be rotated relative to the plane of incidence for the purpose of setting a polarization state.

13. The system as claimed in claim 12, wherein the degree of polarization is adjustable between unpolarized and linearly polarized.

14. The system as claimed in claim 13, wherein a lambda/2 plate is used for setting the polarization state.

15. The system as claimed in claim 5, wherein the prism is formed in asymmetrical fashion.

16. The system as claimed in claim 15, wherein the prism is provided with at least one asymmetrical side.

17. The system as claimed in claim 1, wherein the position of the centroid beam of the laser beam impinging on the resonator body is eccentric.

18. The system as claimed in claim 1, wherein the resonator body is formed in asymmetrical fashion, and in that the centroid beam of the laser beam impinges eccentrically on the resonator body.

19. The system as claimed in claim 1, wherein the surface of the resonator body on which the laser beam impinges is provided with a splitter layer in such a way that it influences the entrance angle of the partial beam entering the resonator body.

20. The system as claimed in claim 19, wherein the splitter layer has a varying thickness.

21. The system as claimed in claim 19, wherein the splitter layer is formed in non-homogeneous fashion.

22. The system as claimed in one of claims 19, 20 or 21, wherein the splitter layer has a dielectric layer.

23. A projection exposure apparatus for semiconductor lithography with a laser as a light source, an illumination system, an illumination plane with a mask and with a projection objective, in which case, for reducing the coherence of a wavefront-emitting laser radiation, the laser beam impinging on a surface of a resonator body is partially reflected with a first partial beam, and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts of at least one partial beam are modulated during a laser pulse, the partial beams which are reflected at the resonator body and which enter the resonator body being superimposed downstream of the resonator body, wherein the resonator body is provided with a phase plate having varying local phase distribution, the phase plate having different thicknesses for the passage of the second partial beam of the laser beam transversely with respect to the beam direction, the different thicknesses of the phase plate varying in the transverse direction in a width s; and wherein the variations in the width s are of the order of magnitude of the spatial coherence length of the laser radiation at the entrance plane.

24. The projection exposure apparatus as claimed in claim 23, wherein the phase plate is formed as a diffractive optical element (DOE) which is optimized to the zeroth order of diffraction.

25. The projection exposure apparatus as claimed in claim 23, wherein a diffusing screen is provided as the phase plate.

26. The projection exposure apparatus as claimed in claim 23, wherein the resonator body is formed as a prism having at least five corners.

27. The projection exposure apparatus as claimed in claim 23, wherein the optical path length of the second partial beam in the resonator body is a multiple of the temporal coherence length.

28. The projection exposure apparatus as claimed in claim 23, wherein at wavelengths of the laser beam of 157 nm or less, calcium fluoride is used as the resonator body.

29. The projection exposure apparatus as claimed in claim 23, wherein the prism is formed in asymmetrical fashion.

30. The projection exposure apparatus as claimed in claim 23, wherein the position of the centroid beam of the laser beam impinging on the resonator body is eccentric.

31. The projection exposure apparatus as claimed in claim 23, wherein the surface of the resonator body on which the laser beam impinges is provided with a splitter layer in such a way that it influences the entrance angle of the partial beam entering the resonator body.

32. The projection exposure apparatus as claimed in claim 31, wherein the splitter layer has a varying thickness and/or is formed a non-homogenous fashion.

33. The projection exposure apparatus as claimed in claim 31 or 32, wherein the splitter layer has a dielectric layer.

34. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s; and wherein a diffusing screen is provided as the phase plate.

35. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s;

wherein the resonator body is formed as a prism having at least five corners; and wherein the prism is formed in asymmetrical fashion.

36. The system as claimed in claim 35, wherein the prism is provided with at least one asymmetrical side.

37. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s; and wherein the position of the centroid beam of the laser beam impinging on the resonator body is eccentric.

38. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s; and wherein the resonator body is formed in asymmetrical fashion, and in that the centroid beam of the laser beam impinges eccentrically on the resonator body.

39. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s; and wherein the surface of the resonator body on which the laser beam impinges is provided with a splitter layer in such a way that it influences the entrance angle of the partial beam entering the resonator body.

40. The system as claimed in claim 39, wherein the splitter layer has a varying thickness.

41. The system as claimed in claim 39, wherein the splitter layer is formed in non-homogeneous fashion.

42. The system as claimed in one of claims 39, wherein the splitter layer has a dielectric layer.

43. A system for reducing the coherence of a wavefront-emitting laser radiation for a projection objective in semiconductor lithography, a first partial beam of the laser beam impinging on a surface of a resonator body being partially reflected and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts and at least one partial beam are modulated during a laser pulse, the partial beams which are reflected at the resonator body and which enter the resonator body being superimposed downstream of the resonator body, and the resonator body being provided with a phase plate having varying local phase distribution, wherein the phase plate has different thicknesses for the passage of the second partial beam of the laser beam transversely with respect to the beam direction, the different thicknesses of the phase plate varying in the transverse direction in a width s; and wherein the light impinging on the resonator body is split in a range of ratios from about 1:3 to about 2:3 with respect to the first reflected partial beam and the second partial beam circulating in the resonator body.

44. A projection exposure apparatus for semiconductor lithography with a laser as a light source, an illumination system, an illumination plane with a mask and with a projection objective, in which case, for reducing the coherence of a wavefront-emitting laser radiation, the laser beam impinging on a surface of a resonator body is partially reflected with a first partial beam, and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts of at least one partial beam are modulated during a laser pulse, the partial beams which are reflected at the resonator body and which enter the resonator body being superimposed downstream of the resonator body, wherein the resonator body is provided with a phase plate having varying local phase distribution, the phase plate having different thicknesses for the passage of the second partial beam of the laser beam transversely with respect to the beam direction, the different thicknesses of the phase plate varying in the transverse direction in a width s; and wherein a diffusing screen is provided as the phase plate.

45. A projection exposure apparatus for semiconductor lithography with a laser as a light source, an illumination system, an illumination plane with a mask and with a projection objective, in which case, for reducing the coherence of a wavefront-emitting laser radiation, the laser beam impinging on a surface of a resonator body is partially reflected with a first partial beam, and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts of at least one partial beam are modulated during a laser pulse, the partial beams which are reflected at the resonator body and which enter the resonator body being superimposed downstream of the resonator body, wherein the resonator body is provided with a phase plate having varying local phase distribution, the phase plate having different thicknesses for the passage of the second partial beam of the laser beam transversely with respect to the beam direction, the different thicknesses of the phase plate varying in the transverse direction in a width s; and wherein the prism is formed in asymmetrical fashion.

46. A projection exposure apparatus for semiconductor lithography with a laser as a light source, an illumination system, an illumination plane with a mask and with a projection objective, in which case, for reducing the coherence of a wavefront-emitting laser radiation, the laser beam impinging on a surface of a resonator body is partially reflected with a first partial beam, and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts of at least one partial beam are modulated during a laser pulse, the partial beams which are reflected at the resonator body and which enter the resonator body being superimposed downstream of the resonator body, wherein the resonator body is provided with a phase plate having varying local phase distribution, the phase plate having different thicknesses for the passage of the second partial beam of the laser beam transversely with respect to the beam direction, the different thicknesses of the phase plate varying in the transverse direction in a width s; and wherein the position of the centroid beam of the laser beam impinging on the resonator body is eccentric.

47. A projection exposure apparatus for semiconductor lithography with a laser as a light source, an illumination system, an illumination plane with a mask and with a projection objective, in which case, for reducing the coherence of a wavefront-emitting laser radiation, the laser beam impinging on a surface of a resonator body is partially reflected with a first partial beam, and a second partial beam of said laser beam entering the resonator body and emerging from the resonator body again after a plurality of total reflections at least approximately in the region of the entrance location and being forwarded with the first partial beam jointly to an illumination plane, the resonator body being formed in such a way that in addition to the splitting into partial beams, the wavefronts of at least one partial beam are modulated during a laser pulse, the partial beams which are reflected at the resonator body and which enter the resonator body being superimposed downstream of the resonator body, wherein the resonator body is provided with a phase plate having varying local phase distribution, the phase plate having different thicknesses for the passage of the second partial beam of the laser beam transversely with respect to the beam direction, the different thicknesses of the phase plate varying in the transverse direction in a width s; and wherein the surface of the resonator body on which the laser beam impinges is provided with a splitter layer in such a way that it influences the entrance angle of the partial beam entering the resonator body.

48. The projection exposure apparatus as claimed in claim 47, wherein the splitter layer has a varying thickness and/or is formed a non-homogenous fashion.

49. The projection exposure apparatus as claimed in claim 47, wherein the splitter layer has a dielectric layer.

* * * * *